United States Patent
Tsai et al.

(10) Patent No.: US 9,196,750 B2
(45) Date of Patent: Nov. 24, 2015

(54) FLASH MEMORY STRUCTURE AND METHOD FOR FORMING THE SAME

(71) Applicant: Taiwan Semiconductor Manufacturing Co., Ltd, Hsin-Chu (TW)

(72) Inventors: Chun-Tse Tsai, New Taipei (TW); Chia-Ping Lai, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/093,269

(22) Filed: Nov. 29, 2013

(65) Prior Publication Data
US 2015/0155394 A1    Jun. 4, 2015

(51) Int. Cl.
| H01L 21/336 | (2006.01) |
| H01L 29/792 | (2006.01) |
| H01L 29/66 | (2006.01) |
| H01L 21/28 | (2006.01) |
| H01L 29/423 | (2006.01) |

(52) U.S. Cl.
CPC ........ *H01L 29/792* (2013.01); *H01L 21/28282* (2013.01); *H01L 29/42344* (2013.01); *H01L 29/66833* (2013.01)

(58) Field of Classification Search
CPC ............ H01L 29/7923; H01L 29/7887; H01L 29/4933; H01L 29/512
USPC .......................................... 438/266; 257/326
See application file for complete search history.

(56) References Cited

U.S. PATENT DOCUMENTS

| 2007/0145455 A1 * | 6/2007 | Yasui et al. .................... 257/314 |
| 2007/0228498 A1 * | 10/2007 | Toba et al. .................... 257/411 |
| 2010/0301404 A1 | 12/2010 | Kawashima |
| 2011/0233649 A1 | 9/2011 | Shimizu |
| 2012/0306001 A1 * | 12/2012 | Hirano .......................... 257/324 |

* cited by examiner

*Primary Examiner* — Caridad Everhart
(74) *Attorney, Agent, or Firm* — Birch, Stewart, Kolasch & Birch, LLP

(57) ABSTRACT

Embodiments of mechanisms of a semiconductor device structure are provided. The semiconductor device structure includes a substrate and a word line cell disposed over the substrate. The semiconductor device structure includes a substrate and a control gate formed over the substrate. The semiconductor device further includes an insulating layer formed on a sidewall of the control gate and a memory gate formed adjacent to the insulating layer. In addition, the insulating layer has a first height, and the memory gate has a second height shorter than the first height.

16 Claims, 10 Drawing Sheets

FLASH MEMORY STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

A flash memory cell has elements such as gate, spacers, and source and drain regions. However, controlling and shrinking the size of those elements in a flash memory cell are still challenging.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1A:
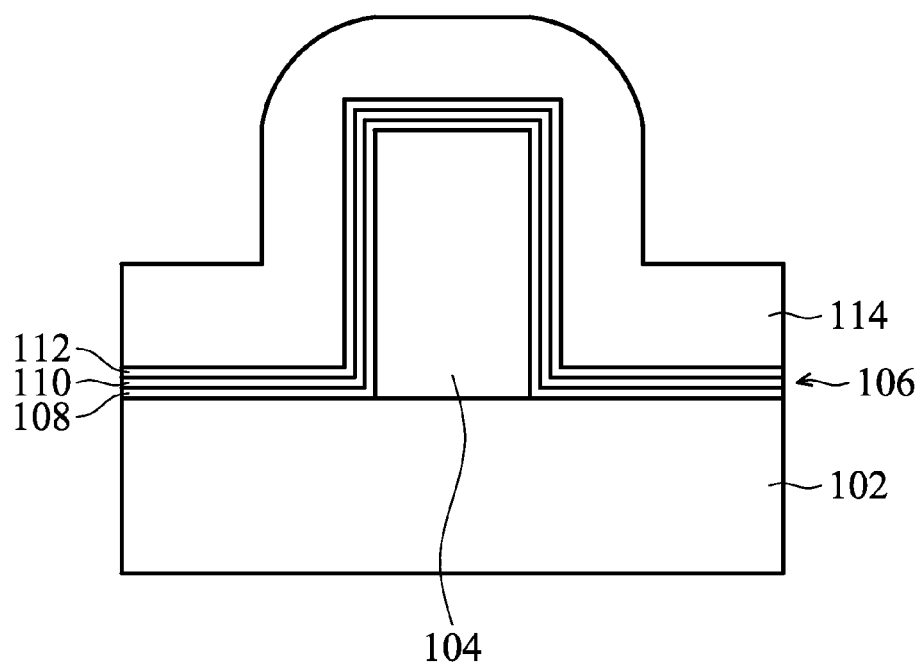
FIGS. 1A to 1D illustrate cross-sectional representations of various stages of forming a flash memory structure in accordance with some embodiments.

Mechanisms for forming a semiconductor device structure are provided in accordance with some embodiments of the disclosure. FIGS. 1A to 1D illustrate cross-sectional representations of various stages of forming a flash memory structure 100a in accordance with some embodiments. Referring to FIG. 1A, a substrate 102 is provided. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, substrate 102 includes structures such as doped regions, isolation features, interlayer dielectric (ILD) layers, and/or conductive features. In addition, substrate 102 may further include single or multiple material layers to be patterned. For example, the material layers may include a silicon layer, a dielectric layer, and/or a doped polysilicon layer.

A polysilicon gate 104 is formed over substrate 102 in accordance with some embodiments. Polysilicon gate 104 may be formed by depositing a polysilicon layer over substrate 102 and patterning the polysilicon layer. In some embodiments, the polysilicon layer is deposited by chemical vapor deposition (CVD), physical vapor deposition (PVD), atomic layer deposition (ALD), high density plasma CVD (HDPCVD), metal organic CVD (MOCVD), or plasma enhanced CVD (PECVD), or thermal process such as furnace deposition. In some embodiments, the polysilicon layer is patterned by forming a photoresist layer over the polysilicon layer, patterning the photoresist layer, and etching the polysilicon layer. In some embodiments, the polysilicon layer is patterned by an anisotropic dry etching process.

After polysilicon gate 104 is formed, an insulating layer 106 is conformally formed over substrate 102 to cover polysilicon gate 104, as shown in FIG. 1A in accordance with some embodiments. In some embodiments, insulating layer 106 is an oxide-nitride-oxide (ONO) film. More specifically, insulating layer 106 includes a first oxide layer 108, a nitride layer 110 formed over first oxide layer 108, and a second oxide layer 112 formed over nitride layer 110. Insulating layer 106 may be formed by CVD, although other applicable depositing processes may alternatively be used.

After insulating layer 106 is formed, a polysilicon layer 114 is conformally formed over insulating layer 106, as shown in FIG. 1A in accordance with some embodiments. In some embodiments, polysilicon layer 114 is formed by a thermal process such as furnace deposition, although other applicable depositing processes may alternatively be used.

Figure 1B:
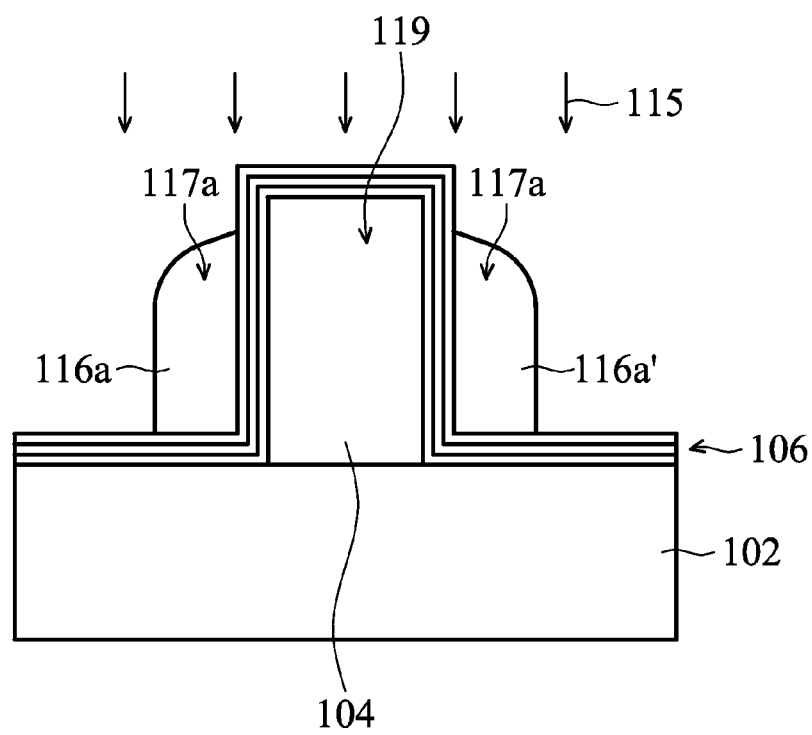

Next, an etching process 115 is performed to remove some portions of polysilicon layer 114, as shown in FIG. 1B in accordance with some embodiments. In some embodiments, etching process 115 is a dry etching process. After etching process 115 is performed, a first polysilicon spacer 116 and a second polysilicon spacer 116' are formed along sidewalls of polysilicon gate 104. In addition, first polysilicon spacer 116 and second polysilicon spacer 116' have sharp top portions 117a being close to a top portion 119 of polysilicon gate 104.

Figure 1C:
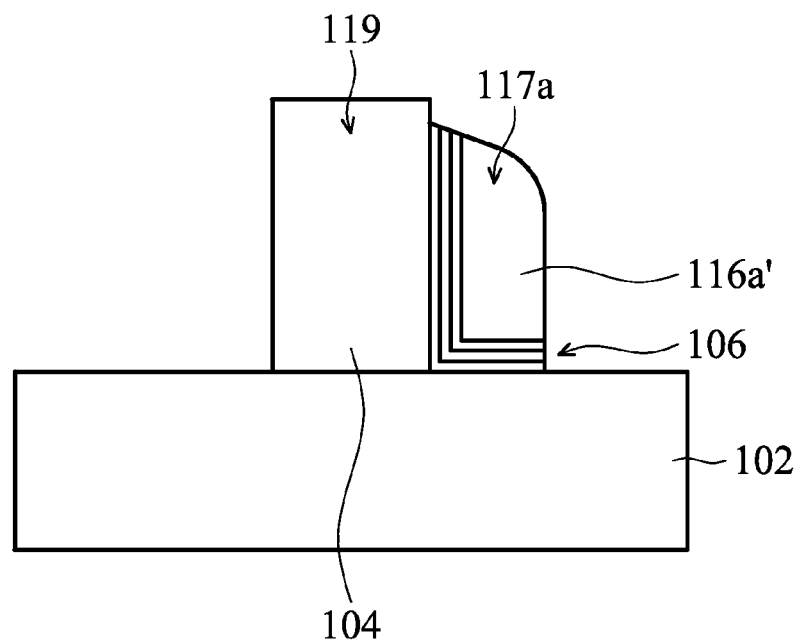

Next, first polysilicon spacer 116a and the portion of insulating layer 106 which is not covered by second polysilicon spacer 116a' are removed, as shown in FIG. 1C in accordance with some embodiments. First polysilicon spacer 116a may be removed by a dry etching process, and the portion of insulating layer 106 not covered by second polysilicon spacer 116a' may be removed by a wet etching process.

Figure 1D:
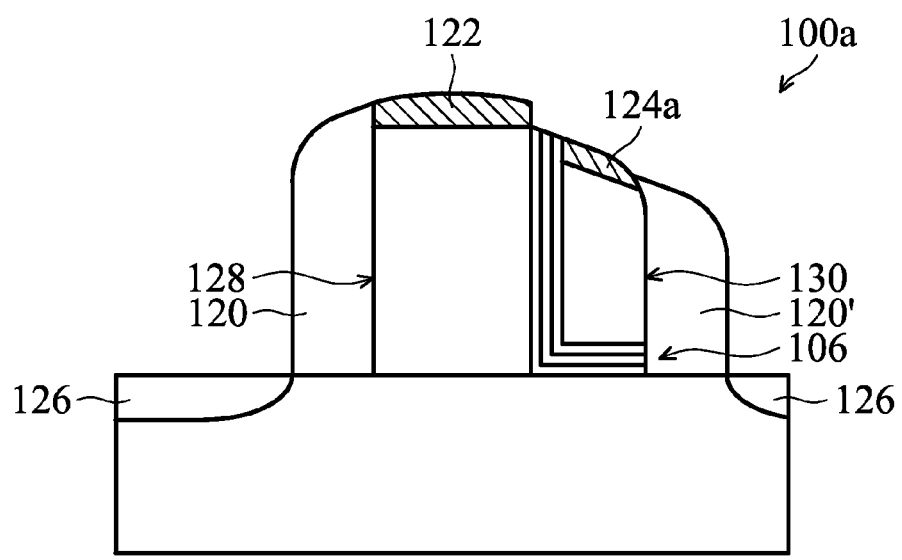

After first polysilicon spacer 116a is removed, a first spacer 120 is formed on a sidewall of polysilicon gate 104, and a second spacer 120' is formed on a sidewall of second polysilicon spacer 116a', as shown in FIG. 1D in accordance with some embodiments. Afterwards, source and drain regions 126 are formed in substrate 102.

Next, a first silicide layer 122 is formed over polysilicon gate 104 to form a control gate 128, and a second silicide layer 124 is formed over second polysilicon spacer 116a' to form a memory gate 130a in accordance with some embodiments. In some embodiments, first silicide layer 122 and second silicide layer 124a are made of nickel silicide, cobalt silicide, or titanium silicide. First silicide layer 122 and second silicide layer 124 may be formed in a self-aligned manner. For example, a salicide process may be performed on the top surface of the polysilicon gate 104 and second polysilicon spacer 116a'. First, a metal layer, such as a cobalt layer, is deposited by a sputtering method on the top surface of polysilicon gate 104 and second polysilicon spacer 116a'. Next, by performing a heat treatment using a rapid thermal annealing (RTA) method, the metal layer and polysilicon of polysilicon gate 104 and second polysilicon spacer 116a' are reacted to form first silicide layer 122 and second silicide layer 124a. Afterwards, the unreacted part of the metal layer is removed.

As described above, second polysilicon spacer 116a' has sharp top portion 117a near top portion 119 of polysilicon gate 104. Therefore, first silicide layer 122 formed on polysilicon gate 104 is too close to second silicide layer 124 formed on second polysilicon spacer 116a', and the risk of circuit shortage between control gate 128 and memory gate 130a (e.g. between first silicide layer 122 and second silicide layer 124a) increases.

Accordingly, in some embodiments, an over-etching process is used to prevent such circuit shortage. FIGS. 2A to 2D illustrate cross-sectional representations of various stages of forming a flash memory structure 100b including over-etching polysilicon layer 114 in accordance with some embodiments. Some elements and manufacturing processes for forming flash memory structure 100b are similar to those for forming flash memory structure 100a and are not repeated herein.

Figure 2A:
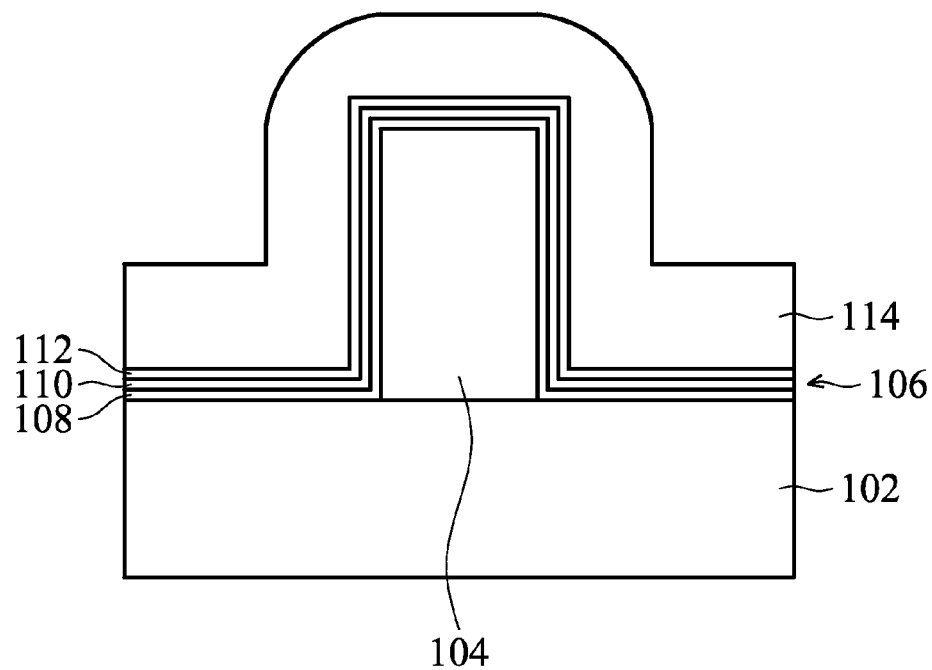
FIGS. 2A to 2D illustrate cross-sectional representations of various stages of forming a flash memory structure including forming a polysilicon spacer by an over-etching process in accordance with some embodiments.

Referring to FIG. 2A, polysilicon gate 104 is formed over substrate 102, and insulating layer 106 and polysilicon layer 114 are conformally formed over substrate 102 to cover polysilicon gate 104, as shown in FIG. 2A in accordance with some embodiments.

Figure 2B:
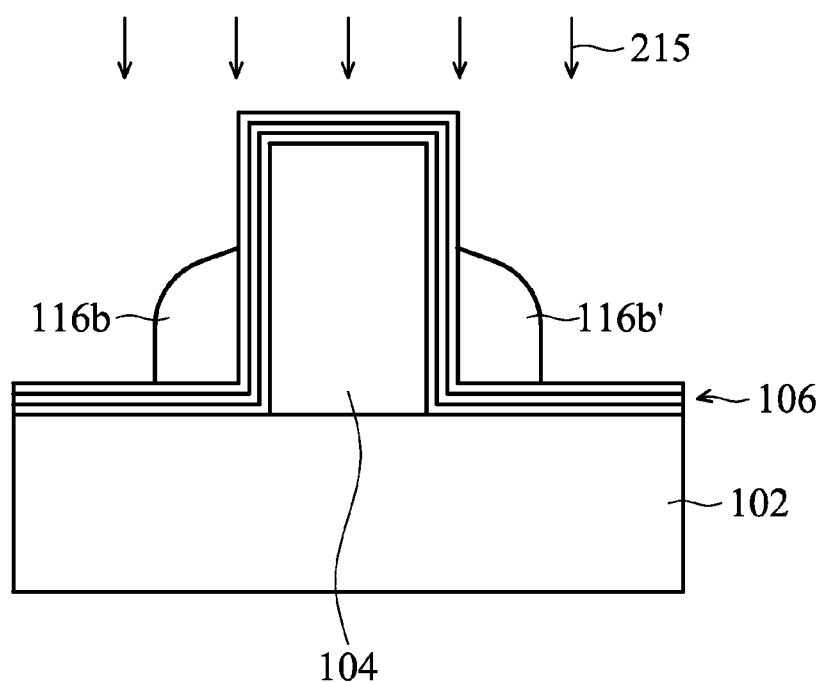

Next, an over-etching process 215 is performed to form a first polysilicon spacer 116b and a second polysilicon spacer 116b', as shown in FIG. 2B in accordance with some embodiments. Compared to etching process 115, over-etching process 215 is performed for a longer time. Therefore, first polysilicon spacer 116b and second polysilicon spacer 116b' formed by over-etching polysilicon layer 114 are shorter than first polysilicon spacer 116a and second polysilicon spacer 116a' shown in FIG. 1D. As a result, although first polysilicon spacer 116b and second polysilicon spacer 116b' also have slanted (or sloping) top surfaces, a top portion 117b of second polysilicon spacer 116b' is relatively far from top portion 119 of polysilicon gate 104.

Figure 2C:
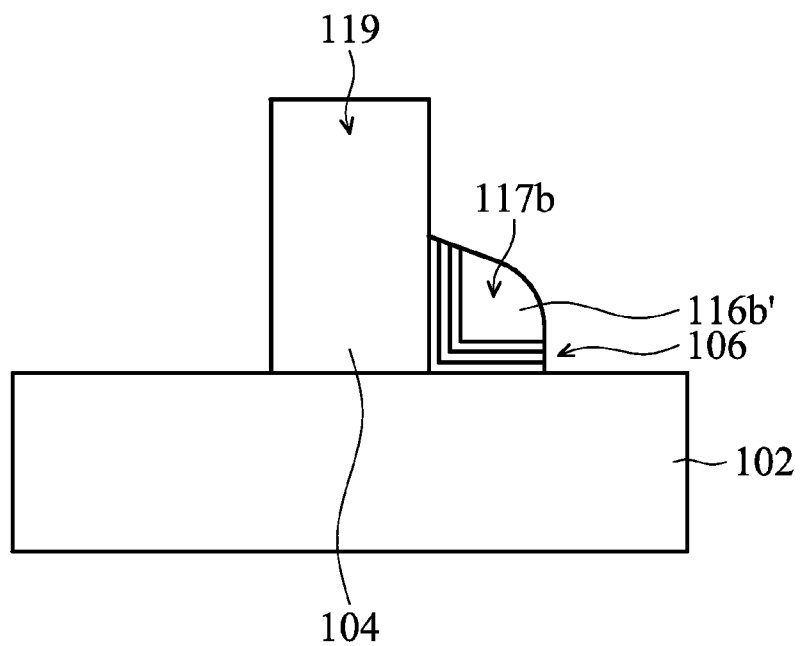

Next, first polysilicon spacer 116b and the portion of insulating layer 106 which is not covered by second polysilicon spacer 116b' are removed, as shown in FIG. 2C in accordance with some embodiments. First polysilicon spacer 116b may be removed by a dry etching process, and the portion of insulating layer 106 not covered by second polysilicon spacer 116b' may be removed by a wet etching process.

Figure 2D:
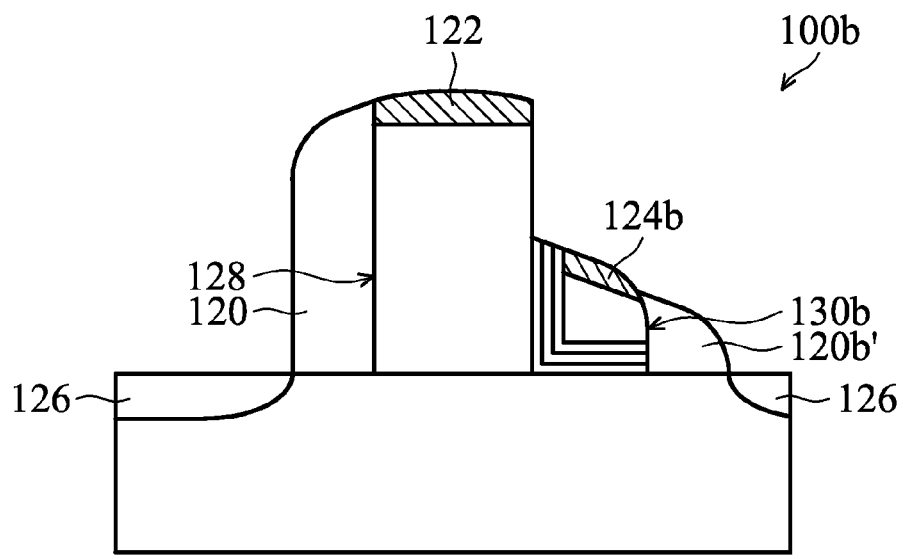

After first polysilicon spacer 116b is removed, first spacer 120 is formed on a sidewall of polysilicon gate 104, and a second spacer 120b' is formed on a sidewall of second polysilicon spacer 116b', as shown in FIG. 2D in accordance with some embodiments. Since second polysilicon spacer 116b' is shorter than second polysilicon spacer 116a' shown in FIG. 1D, second spacer 120b' formed on the sidewall of second polysilicon spacer 116b' is shorter than second spacer 120' shown in FIG. 1D. However, when second polysilicon spacer 116b' is too short, formation of second spacer 120' may become difficult. Afterwards, source and drain regions 126 are formed in substrate 102.

Next, first silicide layer 122 is formed over polysilicon gate 104 to form a control gate 128, and a second silicide layer 124b is formed over second polysilicon spacer 116b' to form a memory gate 130b in accordance with some embodiments. The material and formation of second silicide layer 124b may be similar to, or the same as, second silicide layer 124a described previously.

As described above, since polysilicon layer 114 is over-etched to form second polysilicon spacer 116b' shorter than second polysilicon spacer 116b shown in FIG. 1C, distance between top portion 117b of second polysilicon spacer 116b' and top portion 119 of polysilicon gate 104 is relatively large. Therefore, the risk of circuit shortage between control gate 128 and memory gate 130b (e.g. between first silicide layer 122 and second silicide layer 124b) is reduced.

However, since over-etching process 215 is performed for a relatively long time, a great amount of electric charges may be trapped in insulating layer 106 (e.g. nitride layer 110). The charging effect may result in an increase of the threshold voltage of flash memory structure 100b. In addition, substrate 102 or other elements formed in/over substrate 102 (not shown) may be damaged during over-etching process 215.

Furthermore, second polysilicon spacer 116b' may have poor uniformity since the height of second polysilicon spacer 116b' is difficult to control during over-etching process 215. Moreover, if second polysilicon spacer 116b' formed by over-etching process 215 is too short, the resulting memory gate 130b may malfunction, and the risk for circuit shortage between memory gate 130b and source and drain regions 126 increases.

Accordingly, in some embodiments, a flash memory structure having a greater distance between its control gate and memory gate is formed without using over-etching process 215. FIGS. 3A to 3K illustrate cross-sectional representations of various stages of forming a flash memory structure 100c without using over-etching process 215 in accordance with some embodiments. Some elements and manufacturing processes for forming flash memory structure 100c is similar to those for forming flash memory structure 100a and 100b and are not repeated herein.

Figure 3A:
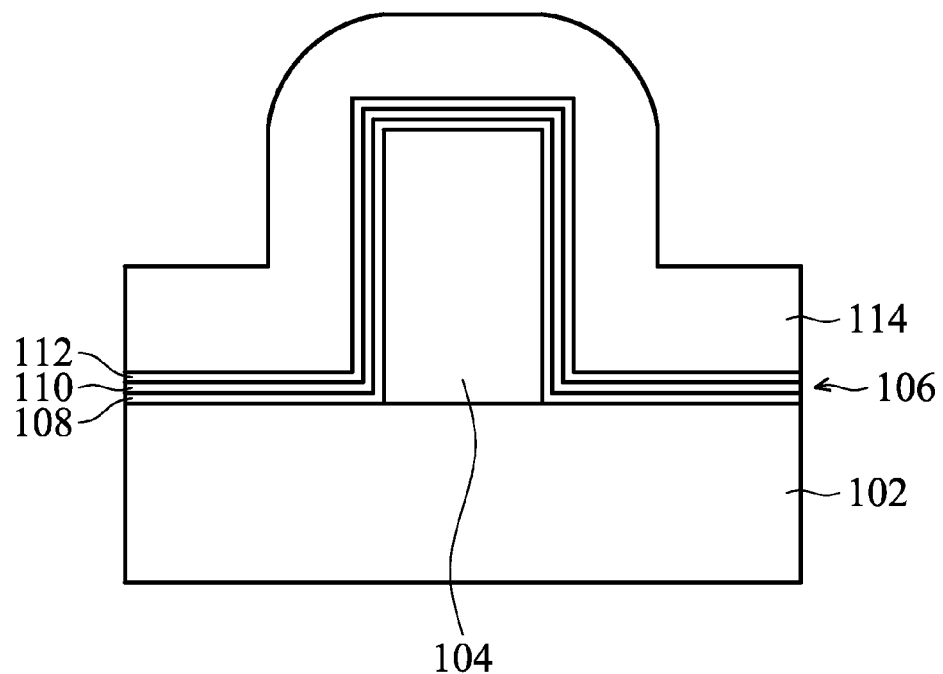
FIGS. 3A to 3K illustrate cross-sectional representations of various stages of forming a flash memory structure without using the over-etching process shown in FIG. 2B in accordance with some embodiments.

Referring to FIG. 3A, substrate 102 is provided. Polysilicon gate 104 is formed over substrate 102 in accordance with some embodiments. After polysilicon gate 104 is formed, insulating layer 106, including first oxide layer 108, nitride layer 110, and second oxide layer 112, is conformally formed over substrate 102 to cover polysilicon gate 104. In some embodiments, insulating layer 106 (e.g. an ONO layer) has a thickness in a range from about 10 nm to about 90 nm. When the thickness of insulating layer 106 is too large, the threshold voltage of the resulting flash memory structure 100c increases. However, when the thickness of insulating layer 106 is too small, risks of circuit voltage increase.

Figure 3B:
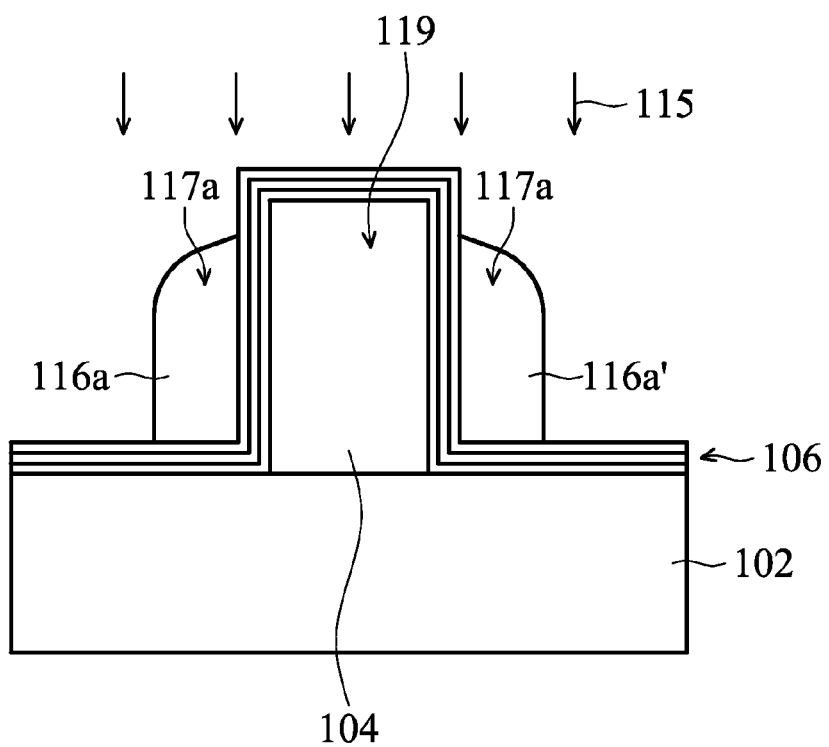

After insulating layer 106 is formed, polysilicon layer 114 is conformally formed on insulating layer 106. Next, etching process 115 is performed to form first polysilicon spacer 116a and second polysilicon spacer 116a' along the sidewalls of polysilicon gate 104, as shown in FIG. 3B in accordance with some embodiments. In addition, first polysilicon spacer 116a and second polysilicon spacer 116a' have sharp top portions 117a being close to top portion 119 of polysilicon gate 104.

Figure 3C:
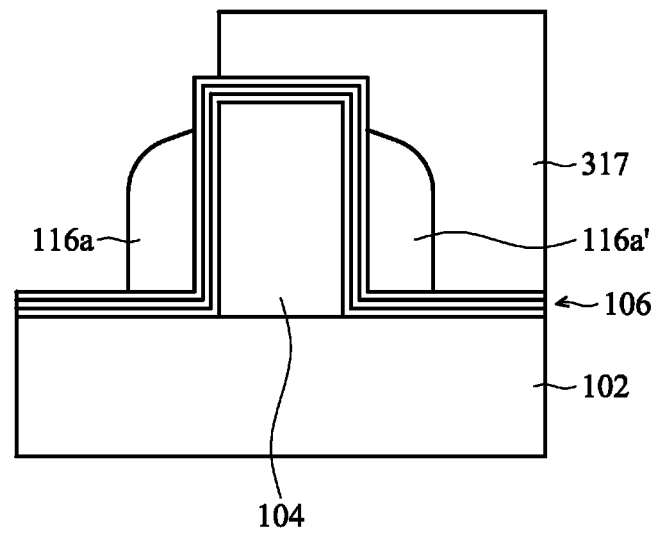

Next, a photoresist layer 317 is formed to cover second polysilicon spacer 116a', as shown in FIG. 3C in accordance with some embodiments. In some embodiments, photoresist layer 317 is formed by forming a photoresist layer and patterning the photoresist layer afterwards. As shown in FIG. 3C, photoresist layer 317 also covers a portion of polysilicon gate 104 in accordance with some embodiments.

Figure 3D:
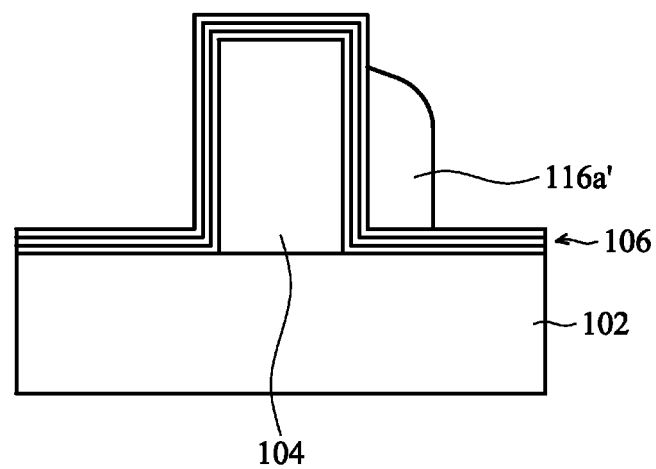
Figure 3:
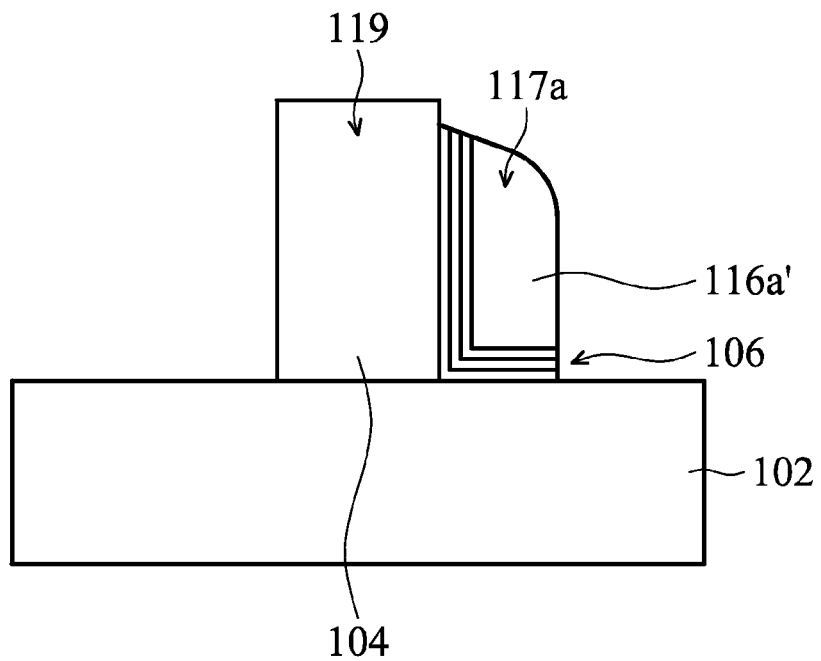
Figure 3:
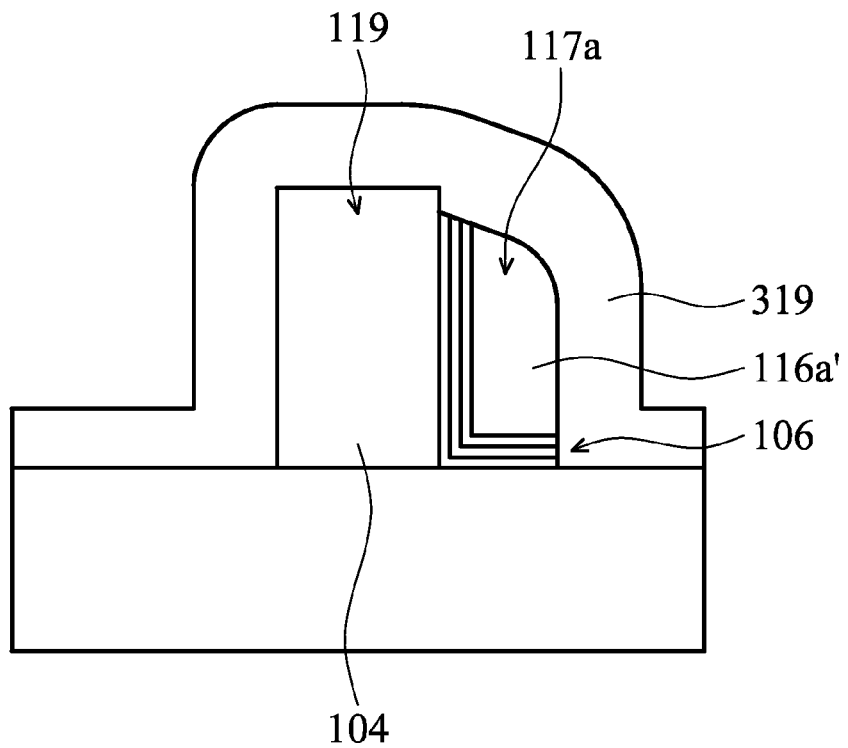

After photoresist layer 317 is formed, first polysilicon spacer 116a is removed, as shown in FIG. 3D in accordance with some embodiments. In some embodiments, first polysilicon spacer 116a is not covered by photoresist layer 317 and is removed by an isotropic dry etching process. Afterwards, another etching process, such as a wet etching process, is performed to remove exposed portions of insulating layer 106, as shown in FIG. 3E in accordance with some embodiments.

Next, a dielectric layer 319 is conformally formed over substrate 102 to cover polysilicon gate 104 and second polysilicon spacer 116a', as shown in FIG. 3F in accordance with some embodiments. In some embodiments, dielectric layer 319 is made of silicon nitride, silicon dioxide, silicon oxide, or other applicable insulating materials. In some embodiments, dielectric layer 319 is formed by CVD. It should be noted that, although dielectric layer 319 shown in FIG. 3F only includes a single layer, in some other embodiments, dielectric layer 319 also include multilayers.

Figure 3G:
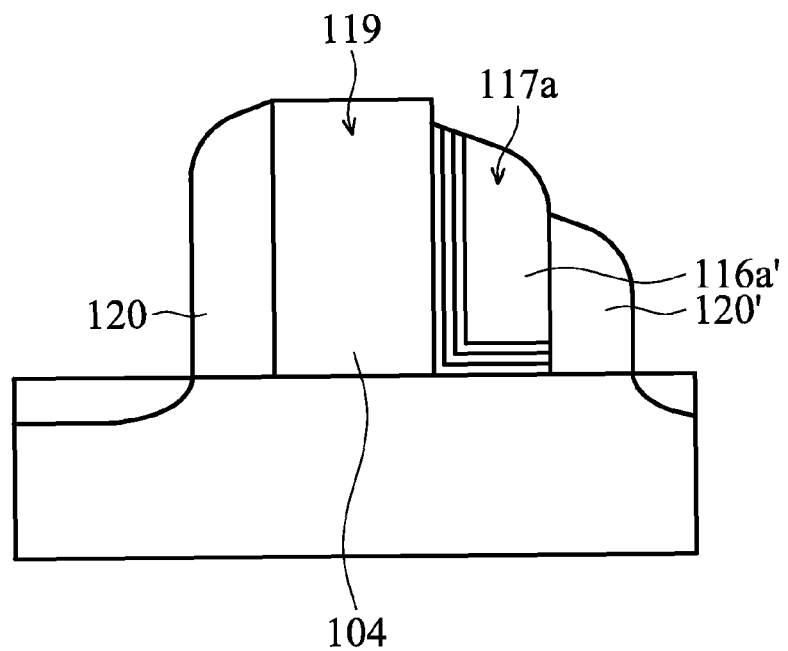

Afterwards, dielectric layer 319 is further etched to form first spacer 120 and second spacer 120', as shown in FIG. 3G in accordance with some embodiments. In some embodiments, dielectric layer 319 is etched by an anisotropic dry etching process. First spacer 120 is formed on the sidewall of polysilicon gate 104, second spacer 120' is formed on the sidewall of second polysilicon spacer 116b. After first spacer 120 and second spacer 120' are formed, source and drain regions 126 are formed in substrate 102. As shown in FIG. 3G, second polysilicon spacer 116a' has a relatively greater height (compared to second polysilicon spacer 116b' shown in FIG. 2C), and it is easier to form second spacer 120' on the sidewall of second polysilicon spacer 116b'.

Figure 3H:
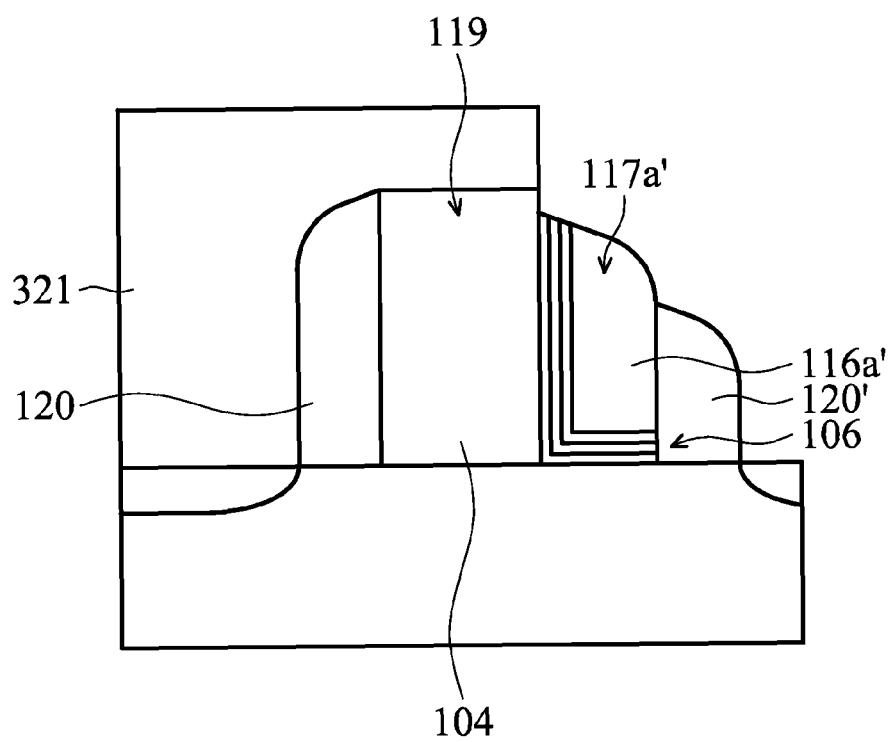
Figure 3:
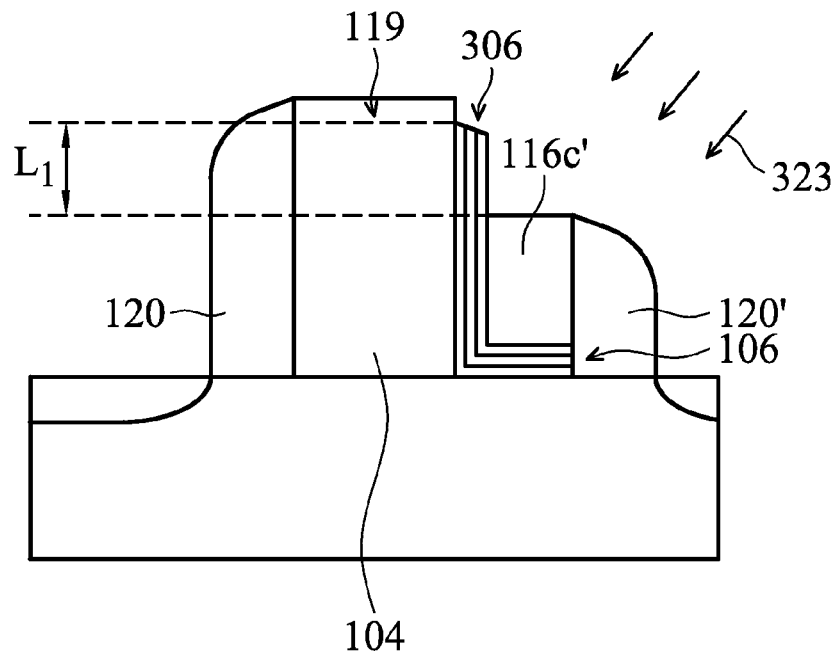
Figure 3:
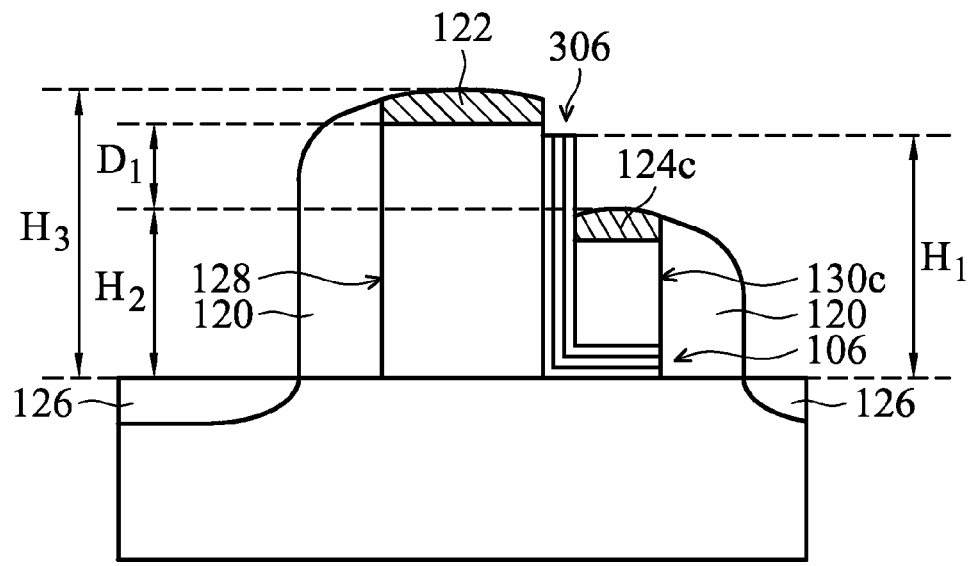

Next, a photoresist layer 321 is formed over substrate 102 to cover polysilicon gate 104 and first spacer 120, as shown in FIG. 3H in accordance with some embodiments. In addition, second polysilicon spacer 116a' is exposed by photoresist layer 321.

Afterwards, a wet etching process 323 is performed to remove sharp top portion 117a of second polysilicon spacer 116a' to form a shortened polysilicon spacer 116c', as shown in FIG. 3I in accordance with some embodiments. During wet etching process 323, a bottom portion of second polysilicon spacer 116a' is protected by second spacer 120' and therefore is not removed.

After wet etching process 323 is performed, the top surface of shortened polysilicon spacer 116c' is substantially level with the top surface of second spacer 120'. Since top portion 117a of second polysilicon spacer 116a' is removed by wet etching process 323 instead of by a dry etching process, the top surface of shortened polysilicon spacer 116c' is substantially parallel to the top surface of substrate 102 in accordance with some embodiments. In addition, the distance between the top surface of shortened polysilicon spacer 116c and top portion 119 of polysilicon gate 104 is relatively large.

Furthermore, as shown in FIG. 3I, during wet etching process 323, sharp top portion 117a of second polysilicon spacer 116a' is removed, while an upper portion 306 of insulating layer 106 is not removed. Therefore, the height of insulating layer 106 on the sidewall of polysilicon gate 104 is greater than the height of shortened polysilicon spacer 116c'. That is, upper portion 306 of insulating layer 106 is exposed (e.g. not covered) by shortened polysilicon spacer 116c'.

In some embodiment, upper portion 306 of insulating layer 106 not covered by shortened polysilicon spacer 116c' has a length $L_1$ in a range from about 5 nm to about 150 nm. When length $L_1$ is too small, risks of circuit shortage increase. However, when length $L_1$ is too large, shortened polysilicon spacer 116c' is too short to form elements, such as a memory gate and source and drain regions 126, in the sequential processes.

Next, first silicide layer 122 is formed over polysilicon gate 104 to form control gate 128, and a second silicide layer 124c is formed over polysilicon spacer 116b to form a memory gate 130c, as shown in FIG. 3J in accordance with some embodiments. Materials and formation for second silicide layer 124c may be similar to, or the same as, those for second silicide layers 124a and 124b.

As shown in FIG. 3J, insulating layer 106 has a height $H_1$ on the sidewall of control gate 128, and memory gate 130c has a height $H_2$ smaller than height $H_1$. In some embodiments, height $H_1$ is in a range from about 50 nm to about 400 nm. In some embodiments, height $H_2$ is in a range from about 30 nm to 300 nm. When height $H_2$ is too large, risks of circuit shortage between first silicide layer 122 and second silicide layer 124c increase. However, when height $H_2$ is too small, memory gate 130c tends to malfunction and circuit shortage between source and drain regions 126 and memory gate 130c increase.

In some embodiments, a difference between height $H_1$ and height $H_2$ is in a range from about 5 nm to about 150 nm. Similarly, when the difference between height $H_1$ and height $H_2$ is too small, risks of circuit shortage between first silicide layer 122 and second silicide layer 124c increase. However, when the difference between height $H_1$ and height $H_2$ is too large, memory gate 130 tends to be malfunction.

In addition, control gate 128 has a height $H_3$ greater than height $H_1$. In some embodiments, height $H_3$ is in a range from about 60 nm to about 450 nm. In some embodiments, a distance $D_1$ between the bottom surface of first silicide layer 122 and the top surface of second silicide layer 124c is in a range from about 10 nm to about 200 nm. Since distance $D_1$ between first silicide layer 122 and second silicide layer 124c is relatively high, circuit shortage between first silicide layer 122 and second silicide layer 124c can be prevented.

Figure 3K:
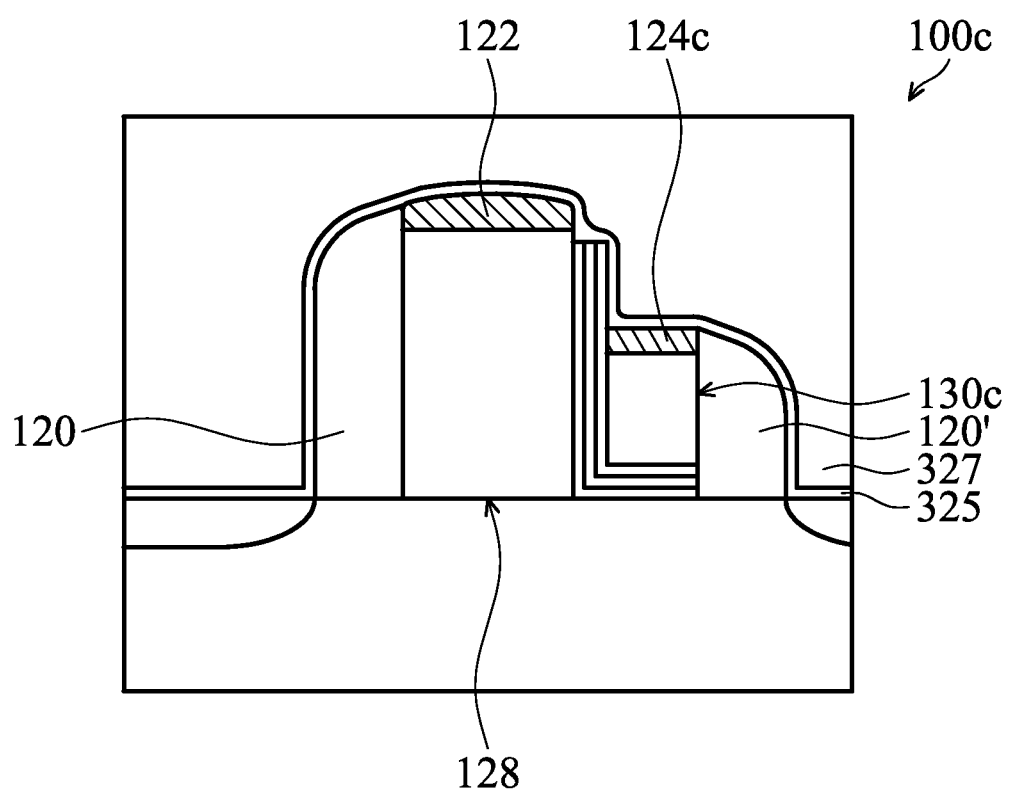

Next, a contact etch stop layer 325 is conformally formed over substrate 102 to cover control gate 128 and memory gate 130c, as shown in FIG. 3K in accordance with some embodiments. In some embodiments, contact etch stop layer 325 is made of dielectric materials such as SiN or SiON. In some embodiments, contact etch stop layer 325 is formed by CVD.

After contact etch stop layer 325 is formed, an interlayer dielectric layer 327 is formed on contact etch stop layer 325 over substrate 102 in accordance with some embodiments. In some embodiments, interlayer dielectric layer 327 is an extremely low dielectric constant (ELK) interlayer dielectric layer. In some embodiments, interlayer dielectric layer 327 is made of fluorine-doped silicon dioxide, carbon-doped silicon dioxide, or other applicable dielectric materials. Interlayer dielectric layer 327 may be formed by CVD. It should be noted that interlayer dielectric layer 327 may be a single layer or may include multilayers made of various materials, and the scope of the disclosure is not intended to be limiting.

As described previously, distance $D_1$ between first silicide layer 122 and second silicide layer 124c is relatively high (e.g. compared to the distance between first silicide layer 122 and second silicide layer 124a shown in FIG. 1D). Therefore, risks of circuit shortage between first silicide layer 122 and second silicide layer 124c reduce.

In addition, since height $H_1$ of insulating layer 106 is greater than height $H_2$ of memory gate 130c (e.g. compared to memory gate 130b having the same height as insulating layer 106 shown in FIG. 2D), upper portion 306 formed on the sidewall of control gate 128 is not covered by memory gate 130c. Therefore, circuit shortage between control gate 128 and memory gate 130c is prevented.

Furthermore, over-etching process 215 is not performed when flash memory structure 100c is formed. As described previously, over-etching process 215 may result in damaging substrate 102 or other elements formed on substrate 102. In addition, it is difficult to control the height of memory gate 130b (as shown in FIG. 2D) since memory gate 130b is formed by using over-etching process 215. However, when memory gate 130b is too short, memory gate 130b may malfunction, and circuit shortage between memory gate 130b and source and drain regions 126 may occur. Since memory gate 130c is formed by using wet etching process 323 instead of over-etching process 215, the problems described above are avoided.

Embodiments of mechanisms for a flash memory structure are provided. The flash memory structure includes a control gate, an insulating layer formed on a sidewall of the control gate, and a memory gate formed adjacent to the insulating layer. The insulating layer has a first height on the sidewall of the control gate, and the memory gate has a second height smaller than the first height. Therefore, an upper portion of the insulating layer is not covered by the memory gate and is configured to prevent the circuit shortage between the control gate and the memory gate.

In some embodiments, a semiconductor device structure is provided. The semiconductor device structure includes a substrate and a control gate formed over the substrate. The semiconductor device further includes an insulating layer formed on a sidewall of the control gate and a memory gate formed adjacent to the insulating layer. In addition, the insulating layer has a first height, and the memory gate has a second height shorter than the first height.

In some embodiments, a semiconductor device structure is provided. The semiconductor device structure includes a substrate and a control gate formed over the substrate. The semiconductor device structure further includes a memory gate formed adjacent to the control gate over the substrate and an insulating layer formed between the control gate and the memory gate. In addition, the insulating layer comprises an upper portion formed on a sidewall of the control gate without being covered by the memory gate.

In some embodiments, a method for forming a semiconductor device structure is provided. The method for forming the semiconductor device structure includes providing a substrate and forming a polysilicon gate having a first sidewall and a second sidewall over the substrate. The method further includes forming an insulating layer on the second sidewall of the control gate and forming a polysilicon spacer adjacent to the insulating layer. The method further includes forming a spacer on a sidewall of the polysilicon spacer and removing a top portion of the polysilicon spacer to expose an upper portion of the insulating layer. The method also includes forming a first silicide layer over the polysilicon gate to form a control gate and a second silicide layer over the polysilicon spacer to form a memory gate. In addition, the first silicide layer and the second silicide layer is at least separated by the upper portion of the insulating layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a substrate;
   a control gate formed over the substrate, wherein the control gate comprises a first silicide layer;
   an insulating layer formed on a sidewall of the control gate; and
   a memory gate formed adjacent to the insulating layer, wherein the memory gate comprises a second silicide layer;
   wherein the insulating layer has a first height, and the memory gate has a second height shorter than the first height, and wherein a distance between a bottom surface of the first silicide layer and a top surface of the second silicide layer is in a range from about 10 nm to about 200 nm.

2. The semiconductor device structure as claimed in claim 1, wherein an upper portion of the insulating layer is formed on the sidewall of the control gate without being covered by the memory gate.

3. The semiconductor device structure as claimed in claim 1, wherein a difference between the first height and the second height is in a range from about 5 nm to about 150 nm.

4. The semiconductor device structure as claimed in claim 1, wherein the control gate has a third height greater than the first height.

5. The semiconductor device structure as claimed in claim 1, wherein the insulating layer comprises a first oxide layer, a nitride layer formed over the first oxide layer, and a second oxide layer formed over the nitride layer.

6. The semiconductor device structure as claimed in claim 2, wherein the upper portion of the insulating layer has a length in a range from about 5 nm to about 150 nm.

7. A semiconductor device structure, comprising:
a substrate;
a control gate formed over the substrate, wherein the control gate comprises a first silicide layer;
a memory gate formed adjacent to the control gate over the substrate, wherein the memory gate comprises a second silicide layer; and
an insulating layer formed between the control gate and the memory gate;
wherein the insulating layer comprises an upper portion formed on a sidewall of the control gate without being covered by the memory gate, and wherein a distance between a bottom surface of the first silicide layer and a top surface of the second silicide layer is in a range from about 10 nm to about 200 nm.

8. The semiconductor device structure as claimed in claim 7, wherein the insulating layer comprises a first oxide layer, a nitride layer formed over the first oxide layer, and a second oxide layer formed over the nitride layer.

9. The semiconductor device structure as claimed in claim 7, wherein the upper portion of the insulating layer has a length in about 5 nm to about 150 nm.

10. The semiconductor device structure as claimed in claim 7, wherein a top surface of the second silicide layer is substantially parallel to a top surface of the substrate.

11. A method for forming a semiconductor device structure, comprising:
providing a substrate;
forming a polysilicon gate having a first sidewall and a second sidewall over the substrate;
forming an insulating layer on the second sidewall of the control gate;
forming a polysilicon spacer adjacent to the insulating layer;
forming a spacer on a sidewall of the polysilicon spacer;
removing a top portion of the polysilicon spacer to expose an upper portion of the insulating layer; and
forming a first silicide layer over the polysilicon gate to form a control gate and a second silicide layer over the polysilicon spacer to form a memory gate,
wherein the first silicide layer and the second silicide layer is at least separated by the upper portion of the insulating layer.

12. The method for forming a semiconductor device structure as claimed in claim 11, wherein the top portion of the polysilicon spacer is removed by a wet etching process.

13. The method for forming a semiconductor device structure as claimed in claim 11, wherein the upper portion of the insulating layer has a length in a range from about 5 nm to about 150 nm.

14. The method for forming a semiconductor device structure as claimed in claim 11, wherein forming the polysilicon spacer adjacent to the insulating layer further comprises:
forming a polysilicon layer over the substrate to cover the polysilicon gate;
performing a dry etching process to form the polysilicon spacer.

15. The method for forming a semiconductor device structure as claimed in claim 11, a distance between a bottom surface of the first silicide layer and a top surface of the second silicide layer is in a range from about 10 nm to about 200 nm.

16. The method for forming a semiconductor device structure as claimed in claim 11, wherein removing the top portion of the polysilicon spacer further comprises:
forming a photoresist layer over the substrate to cover the polysilicon gate;
removing the top portion of the polysilicon spacer while a bottom portion of the polysilicon spacer is protected by the polysilicon spacer; and
removing the photoresist layer.

* * * * *